July 30, 1957 S. W. DODGE, JR 2,801,347

MULTI-ELECTRODE SEMICONDUCTOR DEVICES

Filed March 17, 1953

INVENTOR.
STEPHEN W. DODGE

BY J. L. Whittaker
ATTORNEY

United States Patent Office 2,801,347

Patented July 30, 1957

2,801,347

MULTI-ELECTRODE SEMICONDUCTOR DEVICES

Stephen Webster Dodge, Jr., Princeton, N. J., assignor to Radio Corporation of America, a corporation of Delaware Application March 17, 1953, Serial No. 342,816

5 Claims. (Cl. 307—88.5)

Figure 1:
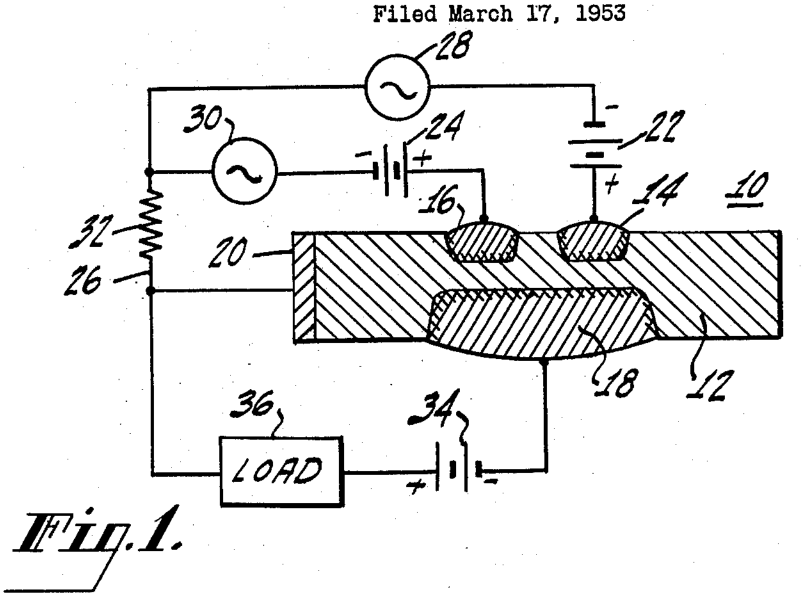

This invention relates to semiconductor devices and particularly to multi-electrode, P-N junction-type semiconductor devices.

A typical junction type semiconductor device comprises a body of semiconductor material of one type of conductivity having one or more P-N junctions formed therein. The P-N junctions comprise zones of N-type and P-type conductivity material separated by rectifying barriers which have high resistance to electrical current flow in one direction and low resistance to such flow in the reverse direction.

One type of semiconductor device to which the principles of the invention apply is known as a transistor and may include three separate regions of semiconductor material arranged either in P—N—P or N—P—N order. In such devices, one of the semiconductor regions is operated as an emitter electrode and injects minority charge carriers into a second region, said carriers being collected by the third region which is operated as a collector electrode. A base electrode is generally connected in ohmic contact with the second region and serves to control the emitter-to-collector current flow.

Such a device is limited, in a sense, in the operations it may perform and is generally employed as an amplifier, oscillator, or the like. However, it usually cannot be used to perform more complex electrical functions such as signal mixing, signal adding and the like.

Accordingly, one object of this invention is to provide a semiconductor device of new and improved form.

Another object is to provide a semiconductor device capable of performing comparatively complex electrical operations.

In general, the purposes and objects of this invention are accomplished by the provision of a body of semiconductor material having a plurality of P-N junction electrodes formed in one surface thereof and a single P-N junction electrode formed in the opposite surface. An ohmic contact base electrode is also connected to the body. The plurality of P-N junction electrodes in the one surface is operated as emitter electrodes and may have separate signals applied to each and the single junction electrode is operated as the collector electrode.

Figure 2:
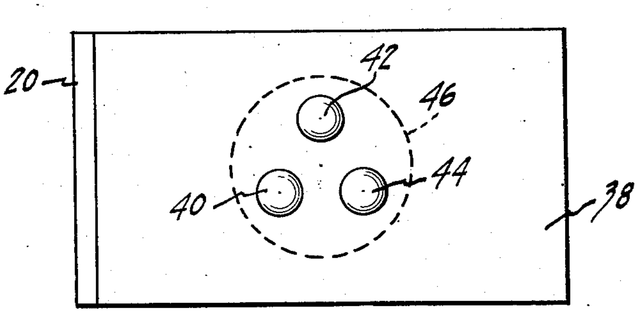

The invention is described with reference to the drawing wherein:

Fig. 1 is a sectional, elevational view of a first embodiment of the invention; and, Fig. 2 is a plan view of a second embodiment of the invention.

Similar elements are designated by similar reference numerals throughout.

Referring to Figure 1, a semiconductor device 10, according to the invention, comprises a body or crystal 12 of semiconductor material, preferably in the form of a thin disk. The crystal 12 is of germanium or silicon or the like of N-type of P-type conductivity. In one embodiment of the invention, one surface of the crystal has a pair of P-N junction electrodes 14 and 16 formed therein and intended for operation as emitter electrodes. Another P-N junction electrode 18, intended for operation as a collector electrode, is formed in the opposite surface of the crystal 12. The P-N junction 18 intended for operation as the collector electrode is considerably larger than the emitter junction electrodes 14 and 16 and is arranged to collect substantially all charges injected by the emitters.

One satisfactory method for forming the P-N junction electrodes is described in a co-pending U. S. application of Charles W. Mueller, Serial No. 295,304, filed June 24, 1952 and assigned to the assignee of this application. According to the method described in said application, the semiconductor block 12 is given a preliminary surface treatment and disks or pellets of a so-called impurity material are placed in contact with opposite surfaces thereof. The assembly of block and pellets is heated in an atmosphere of hydrogen, or an inert gas such as argon, which has first been de-oxidized and dried in a liquid air trap. The heating is effected at a temperature sufficient to cause the pellets to melt and alloy with the semiconductor block to form the desired junction electrodes including regions of opposite type conductivity material separated by rectifying barriers.

If the body 12 of the device 10 comprises N-type semiconductor material, then any one of indium, gallium, aluminum, zinc or boron, for example, may be used as the impurity material. If the semiconductor body is of P-type material, then any one of phosphorus, arsenic, antimony or bismuth, for example, may be used as the impurity material.

The electrodes 14 and 16 are preferably formed with comparatively close spacing and the electrode 18 on the opposite surface is substantially centered with respect to them. An ohmic contact base electrode 20 is bonded to the crystal and may take any convenient form. The base electrode may be a tab or a plate or the like or if the crystal is in the form of a disk, it may be a ring around the periphery thereof.

The multi-junction device hereinabove described may be operated as a mixer in a circuit, for example, such as that shown in Figure 1. The electrodes 14 and 16 are operated as emitters and the electrode 18 is operated as the collector. To this end, the electrodes 14 and 16 are biased in the forward direction with respect to the semiconductor body 12. One suitable bias arrangement includes separate batteries 22 and 24 having their positive terminals connected to the electrodes 14 and 16 respectively and their negative terminals connected to the base electrode 20 through a common lead 26. A signal source 28 is connected in circuit with the emitter electrode 14 and another signal source 30 is connected in circuit with the emitter electrode 16. A current limiting resistor 32 may be provided in the common connection 26 between the emitter circuits and the base electrode 20. The collector electrode 18 is biased in the reverse direction with respect to the body 12 by a connection to the negative terminal of a battery 34 the positive terminal of which is connected through a load device 36 to the base electrode 20.

In operation of the circuit shown in Figure 1, the emitter electrodes 14 and 16 inject minority charge carriers into the crystal 12 under the control of the signal sources 28 and 30. The charge carriers are attracted to the collector electrode 18 and a current flows in the collector circuit which represents mixing of the two signals from the sources 28 and 30.

The principles of the invention may be applied to a semiconductor device having more than two emitter electrodes to accommodate more than two input signals. Such a device is shown in Figure 2 and includes a crystal 38 having, for example, three P-N junction emitter electrodes 40, 42, 44 spaced equidistant from each other in one surface of the crystal 38. A single collector electrode 46 is formed in the opposite surface and is centered with respect to the emitter electrodes and substantially equidistant from each of them. A base electrode 20 is also provided on the crystal.

It is to be understood that the devices described may be varied within the scope of the invention. For example the P-N junction electrodes may be formed in other ways, as by nuclear particle bombardment, and the various electrodes may take other forms.

What is claimed is:

1. A semiconductor device comprising a body of semiconductor material having a pair of opposed surfaces, a plurality of P-N junction input electrodes in contact with one of said surfaces of said body, a P-N junction output electrode in contact with the other of said surfaces, said output electrode having a larger area than said input electrodes, and an ohmic contact base electrode mounted on said body.

2. A semiconductor device comprising a body of semiconductor material having a pair of opposed surfaces, a plurality of P-N junction emitter electrodes in contact with one of said surfaces, a P-N junction collector electrode in contact with the other of said surfaces, said collector electrode having a larger area than said emitter electrodes and an ohmic contact base electrode mounted on said body.

3. A semiconductor device comprising a disk-shaped body of semiconductor material having a pair of opposed surfaces, a plurality of P-N junction emitter electrodes in rectifying contact with one of said surfaces, a P-N junction collector electrode in rectifying contact with the other of said surfaces, said collector electrode having a larger area than said emitter electrodes and an ohmic contact electrode mounted on the periphery of said body.

4. A semiconductor device comprising a body of semiconductor material having a pair of opposed surfaces, a plurality of electrodes in rectifying contact with one of said surfaces, another electrode in rectifying contact with the other of said surfaces, said other electrode having a larger area than said plurality of electrodes, and an ohmic electrode in contact with said body.

5. A semiconductor device comprising a body of semiconductor material having a pair of opposed surfaces, a plurality of electrodes in rectifying contact with one of said surfaces, means for biasing said electrodes as emitter electrodes adapted to inject minority charge carriers into said body, another electrode in rectifying contact with the other of said surfaces, said other electrode having a larger area than said plurality of electrodes, means for biasing said other electrode as a collector electrode adapted to collect minority charge carriers from said body, and an ohmic electrode in contact with said body.

References Cited in the file of this patent

UNITED STATES PATENTS

| | | |
|---|---|---|
| 2,476,323 | Rack | July 19, 1949 |
| 2,586,080 | Pfann | Feb. 19, 1952 |
| 2,597,028 | Pfann | May 20, 1952 |
| 2,644,914 | Kircher | July 7, 1953 |
| 2,672,528 | Shockley | Mar. 16, 1954 |
| 2,742,383 | Barnes et al. | Apr. 17, 1956 |